United States Patent [19]

Werking

[11] 4,270,046
[45] May 26, 1981

[54] TWO-TERMINAL OPTICAL SENSOR

[75] Inventor: Paul M. Werking, Richardson, Tex.

[73] Assignee: Texas Instruments Incorporated, Dallas, Tex.

[21] Appl. No.: 947,675

[22] Filed: Nov. 2, 1978

[51] Int. Cl.³ .............................................. G01J 1/32
[52] U.S. Cl. .................................. 250/205; 250/214 R
[58] Field of Search ................... 250/205, 214 R, 551

[56] References Cited

U.S. PATENT DOCUMENTS

| | | | |
|---|---|---|---|
| 3,631,250 | 12/1971 | Buskirk | 250/205 |
| 3,639,768 | 2/1972 | Mancini | 250/205 |
| 3,721,123 | 3/1973 | Heim | 250/205 |
| 3,725,665 | 4/1973 | Talmo | 250/231 E X |
| 4,129,785 | 12/1978 | Kadah | 250/551 |

OTHER PUBLICATIONS

Adirovich et al., "Soviet Physics–Doklady," vol. 11, No. 5, pp. 419–421, Nov. 1966.
Adirovich et al., "Soviet Physics–Doklady, " vol. 14, No. 6, pp. 538–541, Dec. 1969.
Adirovich et al., "Soviet Physics–Doklady," vol. 14, No. 6, pp. 550–552, Dec. 1969.
Adirovich et al., "Soviet Physics–Doklady," vol. 14, No. 6, pp. 578–580, Dec. 1969.

Primary Examiner—David C. Nelms
Assistant Examiner—Darwin R. Hostetter
Attorney, Agent, or Firm—Gary C. Honeycutt; Mel Sharp; Richard L. Donaldson

[57] ABSTRACT

A two-terminal optical sensor circuit comprising a light-emitting diode, phototransistor, amplifier, and current source electrically and optically coupled so as to approximate an ideal switch in one quadrant of its V-I characteristic. A remote object is detected when it moves into the optical path between the light source and sensor.

10 Claims, 16 Drawing Figures

TWO-TERMINAL OPTICAL SENSOR

The two-terminal optical sensor of the invention includes a light-emitting diode (LED), a photodiode or phototransistor light sensor, an amplifier, and a current source configured so as to approximate an ideal two-terminal switch in one quadrant of its V-I characteristic curve. This "switch" is useful for the detection of a remote object, in several applications.

Figure 1:
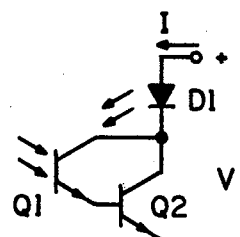
FIG. 1 is a circuit diagram showing a partial embodiment of the invention.
Figure 2:
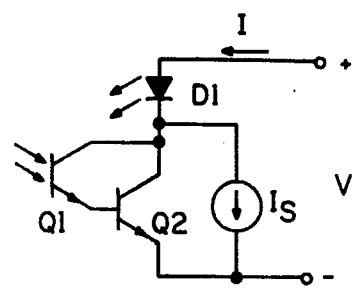
FIGS. 2 and 3 are circuit diagrams showing embodiments of the invention.

The circuit drawn in FIG. 1 includes three of the four elements necessary to form a two-terminal optical sensor (TOS) circuit: a light source (D1), a light sensor (Q1), and an amplifier (Q2). In this circuit D1 and Q1 are optically coupled. Like an SCR, this circuit is normally off or non-conducting until charge is injected into the base of Q2. This produces a current flow between the emitter and collector of Q2. This current also flows through D1 causing it to emit photons. Some of these are coupled to Q1 resulting in the injection of more charge into the base of Q2. This process is regenerative and continues until limited by the external circuit. Also, like the SCR, this circuit will stay "on" once triggered. This triggering can be accomplished by one of two methods: the voltage across the circuit can be increased until either Q1 or Q2 breakdown, or a pulse of light may be applied to Q1. Furthermore, it can be turned "off" by two methods: The externally supplied current may be interrupted or the flow of photons from D1 to Q1 may be interrupted. This circuit therefore has the property that it may be turned "off" optically by a passive remote stimulus which interrupts the optical coupling between the light source and light sensor, but this same passive stimulus cannot turn it "on." An active optical stimulus such as a remote light source must be used to turn it "on" optically. This difficulty may be overcome by adding the fourth element of the TOS, the current source, as shown in FIG. 2. Here the constant current source, $I_s$, insures that a minimum amount of light is always provided by the light source so that the circuit will automatically turn itself "on" whenever sufficient optical coupling is established between the light source and sensor elements. The value of $I_s$ required is directly dependent on amplifier gain, light emitter efficiency, light detector efficiency, and the amount of optical coupling between the emitter and detector elements.

Optical coupling can be applied in two ways: directly in a straight path, and indirectly via a reflective surface. The circuitry of both the transmissive two-terminal optical sensor (TTOS) and the reflective two-terminal optical sensor (RTOS) is fundamentally the same. Differences do result, however, from the great difference in emitter-to-detector coupling exhibited. Due to this, the amplifier of a RTOS needs much more gain than a TTOS amplifier and may also require a stronger current source.

Figure 3:
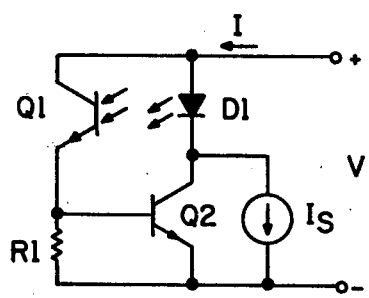

A simple TTOS was fabricated on a small printed circuit board. The circuit used on this card is as shown in FIG. 3 where the current source, $I_s$, is implemented by a 1.0 mA constant current diode. Connecting the collector of Q1 to the anode of D1 reduces the on state voltage of the circuit to essentially the LED forward voltage drop, about 1.3 volts. The "off" state current of the circuit is essentially determined by the constant current diode. Resistor R1 was added to improve the turn-off time of the circuit to about one millisecond. Although both the offstate current and transient switching times of this circuit could be improved by a more sophisticated amplifier, this circuit was found to be an effective and reliable sensor for use in machine control.

Figure 4:
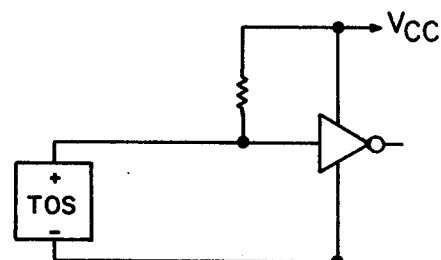
FIGS. 4-6 are circuit diagrams for interfacing the invention with various logic circuits.
Figure 5:
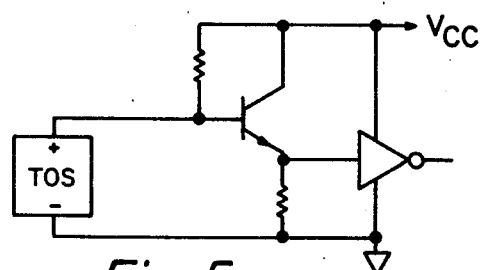
Figure 6:
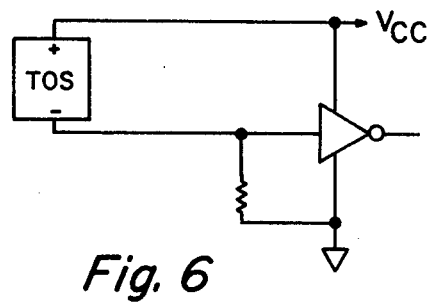

The TOS was initially conceived as a means of simplifying the interface between optical limit sensors and digital computers. The TOS circuit does this by reducing both the cable requirement and analog circuitry needed in a system. Consider a typical interface where the optical sensor, usually a four-terminal device, is wired as a three-terminal device by shorting two of its terminals together. This reduces the number of wires in the interface cable to three per sensor. However, one of these wires is merely used to bias the LED and carries no information. If it were eliminated only two wires per sensor would be needed in the interface cable. This becomes important when the necessary connectors that are a part of any practical system are considered. In a moderately large system having 16 optical sensors wired to one connector, the difficult task of terminating 48 wires on this connector can be reduced to the more managable task of making 32 connections. Of course, if several sensors are physically located close together it is common practice to locate the LED bias resistors near the sensors and use the wire to connect $V_{cc}$ to all resistors. When one wire is also used for the common return line, a cable for N sensors need only have N+2 wires. However, bringing $V_{cc}$ out of the electronics chassis raises the extremely undesirable possibility of shorting the logic power supply. A typical analog interface between sensor and digital logic will consist of a resistor to bias the LED, a pull-up resistor for the phototransistor, and an amplifier, comparator, or perhaps Schmidt trigger. Often this last element may be eliminated for transmissive sensors by providing sufficient bias to the LED (typically 30 mA) and using a high resistance pull-up resistor (say 5k at $V_{cc}=5$ V). However, this limits the ambient temperature that the sensor may operate at and decreases the lifetime of the LED. Reflective sensors always require this last element and in addition, often require that the signal carrying wire be shielded. The TOS provides a strong signal and requires neither LED bias nor amplification. When used with CMOS, ECL, and HTL logic circuits the interface need only consist of a single pull-up resistor as in FIG. 4. To interface with TTL logic, a level shift circuit should be used due to the high on voltage of the TOS, as in FIG. 5. If grounding the $V_{cc}$ line is not a concern, the circuit of FIG. 6 could be used.

In many current applications the TOS is more efficient than a conventional four-terminal sensor due to the absence of a high continuous LED bias current. Consider the case where the phototransistor of a TIL145 transmissive sensor drives a 1000 ohm pull-up resistor connected to +5.0 VDC. To insure proper operation the LED must be biased at 40 mA. The LED will continuously dissipate about 52 mW and the phototransistor will dissipate at least 3 mW when it is on. If a flag passes through the TIL145 sensor with a 50% duty cycle, the average power dissipated by the TIL145 will be 53.5 mW. The sensor of FIG. 3 in this same application would dissipate 4 mW when off and 4.8 mW when on. Its average power dissipation would be 4.4 mW. The average dissipation of its LED would be only 3 mW. The TIL145 could operate at a maximum ambient temperature of 37.5° C. and the TOS could operate at 96° C. Furthermore, the TOS would switch in a millisecond or less while the TIL145 would take about 5 milliseconds to switch.

The TOS also opens up many new applications because it can drive greater loads than present optical sensors. For example, the circuit of FIG. 3, using currently available components, can be sealed to switch as much as 1.0 A and withstand 30 volts. Thus, it is capable of directly driving a small DC motor, relay, or solenoid.

Figure 7:
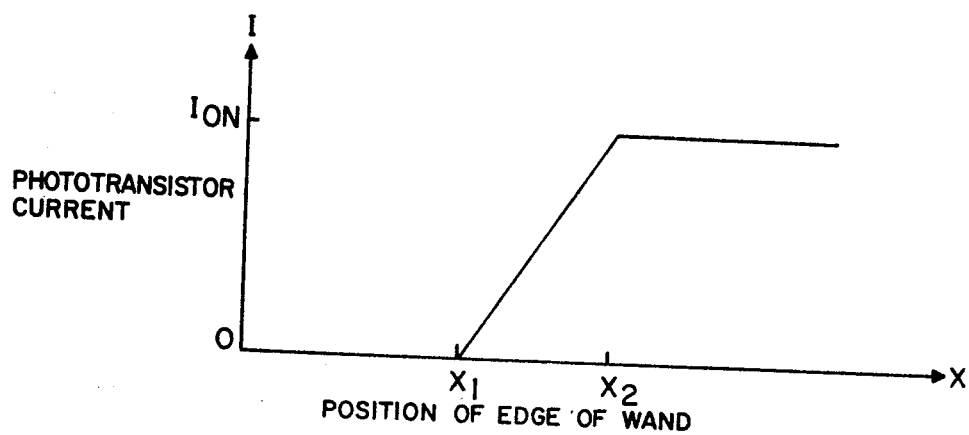
FIGS. 7 and 8 are graphs which compare the transfer characteristic of the invention with that of a phototransistor.
Figure 8:
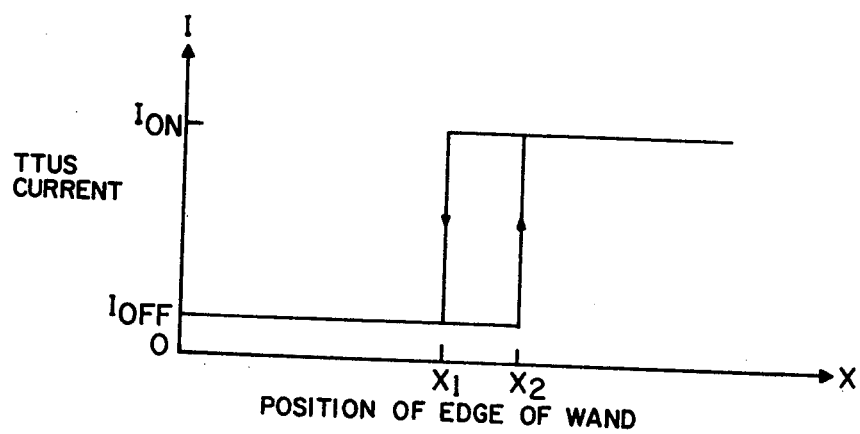

Another feature of the TOS is its "positional hysteresis." This useful feature is a result of the inherent positive feedback employed in the TOS and the direct dependence of amplifier gain on current. In a four-terminal transmissive sensor, for example, a constant bias is applied to the LED so that the photo-transistor current is proportional to the fraction of the collector-base junction area exposed to the light emitted by the LED. If an opaque wand having a sharp edge would pass between the LED and phototransistor, the transfer characteristic of phototransistor current versus wand edge position would be approximately linear as shown in FIG. 7. The TTOS, however, is digital in nature and exhibits a transfer characteristic similar to that shown in FIG. 8. Whenever a wand moving in the positive x direction reaches position $x_2$, the TTOS will turn "on". It will then remain on until the wand moves back to position $x_1$. In the conventional transmissive sensor the turn-on and turn-off times are largely dependent on flag velocity; whereas in the TTOS the switching times are nearly independent of flag velocity.

A TOS also could be fabricated from two monolithic integrated circuits with decided advantage. One chip could be made on a silicon substrate and contain the phototransistor (or photodiode), amplifier, and current source elements while the other chip containing the LED could be made from gallium arsenidephosphide. On the silicon chip, a more sophisticated amplifier element could be built. An amplifier having more gain would allow for a decrease in current source current, $I_s$, and would also allow for the use of a smaller photodiode having less capacitance. This, as well as an amplifier with lower input impedance, would greatly reduce switching times. The primary limiting factor on $I_s$ is LED efficiency at low circuits. Furthermore, a photodiode light sensor used in the photovoltaic mode rather than the photoconductive more would reduce the effect of temperature on the TOS and allow for a possible increase in breakdown voltage. The GaAsP chip would not necessarily have to contain an infrared LED. Visible LED's could also be used and would be a valuable maintenance feature.

Figure 9A:
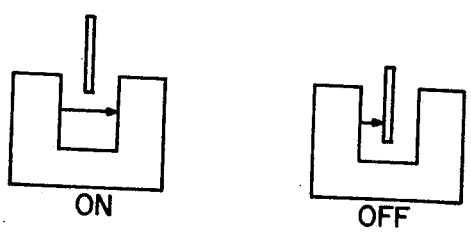
FIGS. 9a-9c are schematic diagrams illustrating the utility of the invention.
Figure 9B:
Figure 9C:
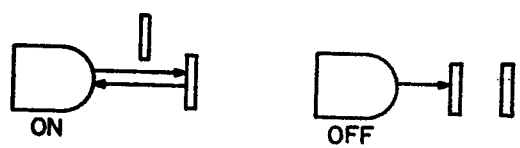

Two-terminal optical sensors may be applied in three ways: A TTOS may be used to sense the presence of an opaque "wand" between light source and sensor as in FIG. 9a; a RTOS may be used to sense the presence of a reflective surface as in FIG. 9b; or a RTOS may be used with a mirror to sense an opaque object passing between it and the mirror as in FIG. 9c. When the appropriate remote optical stimulus is present the TTOS turns off while the RTOS in FIG. 9b turns on and the RTOS of FIG. 9c turns off. The TTOS is, for all practical purposes, insensitive to normal levels of indoor ambient light. The RTOS, however, is somewhat sensitive to normal levels of ambient light. Care should be taken to insure that it is not pointed directly at a source of light, such as a window or light bulb, in normal operation. In the TOS, increasing ambient light has the effect of increasing the off state current level. Otherwise, basic operation of the switch is left unchanged. However, the circuit in which the TOS is used may or may not be able to distinguish between the TOS on state and an increased off state current. Again consider the example of a TOS used with a 1000 ohm pull-up resistor connected to 5 VDC. If the threshold of the digital circuit was 2.5 VDC then it would not be able to distinguish between the normal "on" state and a 2.5 mA "off" state current.

A "light controlled rectifier" circuit equivalent to that in FIG. 1 was demonstrated. This circuit was found to have a V-I characteristic similar to that of an SCR. The triggering and storage capabilities of this circuit were demonstrated. Similar circuits have also appeared in technical literature, references 1-4.

Figure 10:
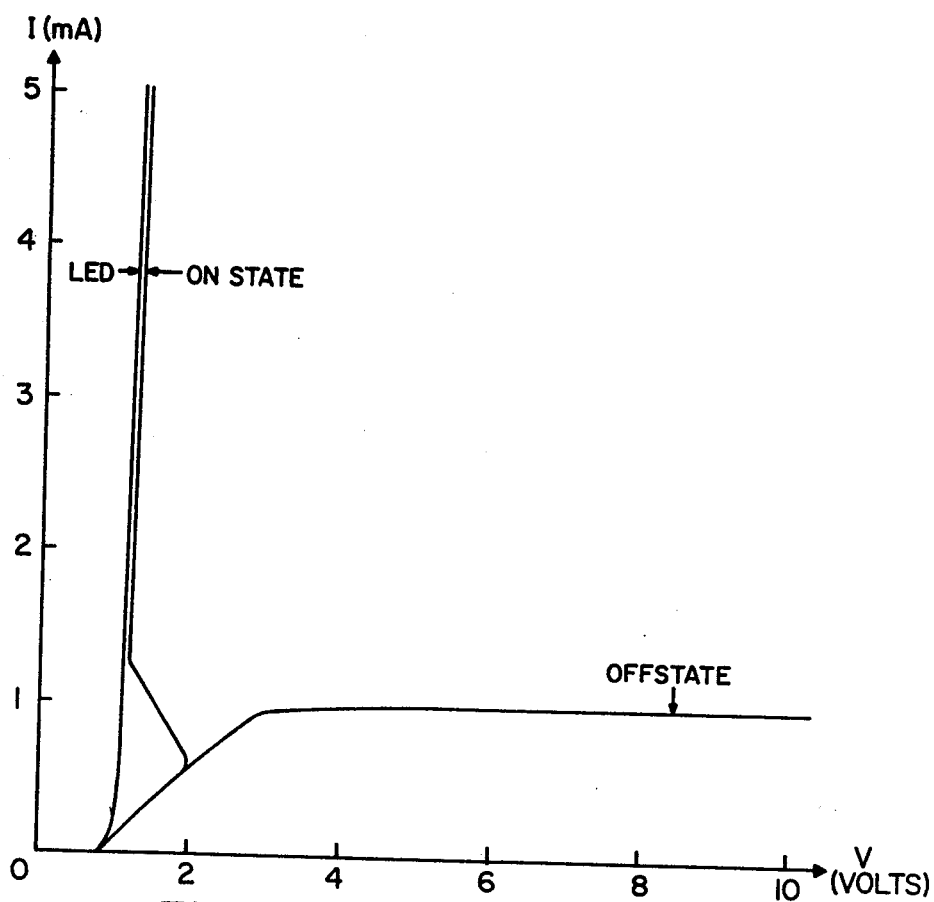
FIGS. 10 and 14 are curves which show the V-I relationships for two embodiments of the invention.

A current source was added to form a TTOS according to the present invention. Its V-I characteristic was measured as well as data on breakover voltage as a function of $I_s$. Switching times of a TTOS were investigated. Turn-on time for this first circuit was on the order of 10 milliseconds and turn-off time was about 20 milliseconds. An improved circuit was tested having a turn-on and turn-off time on the order of 1.0 mSec. This experiment was repeated using a motor driven slotted disc as the flag. Switching times remained largely the same. Turn-off time was found to be dependent on phototransistor capacitance and amplifier input impedance while turn-on time was found to be a function of $I_s$. The V-I characteristic of this circuit is sketched in FIG. 10. Turn-on time was also found to be dependent on amplifier gain.

Figure 11:
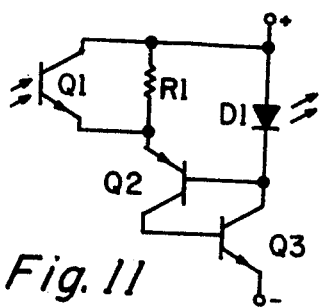
FIGS. 11-13 are circuit diagrams showing various preferred embodiments of the invention.
Figure 14:
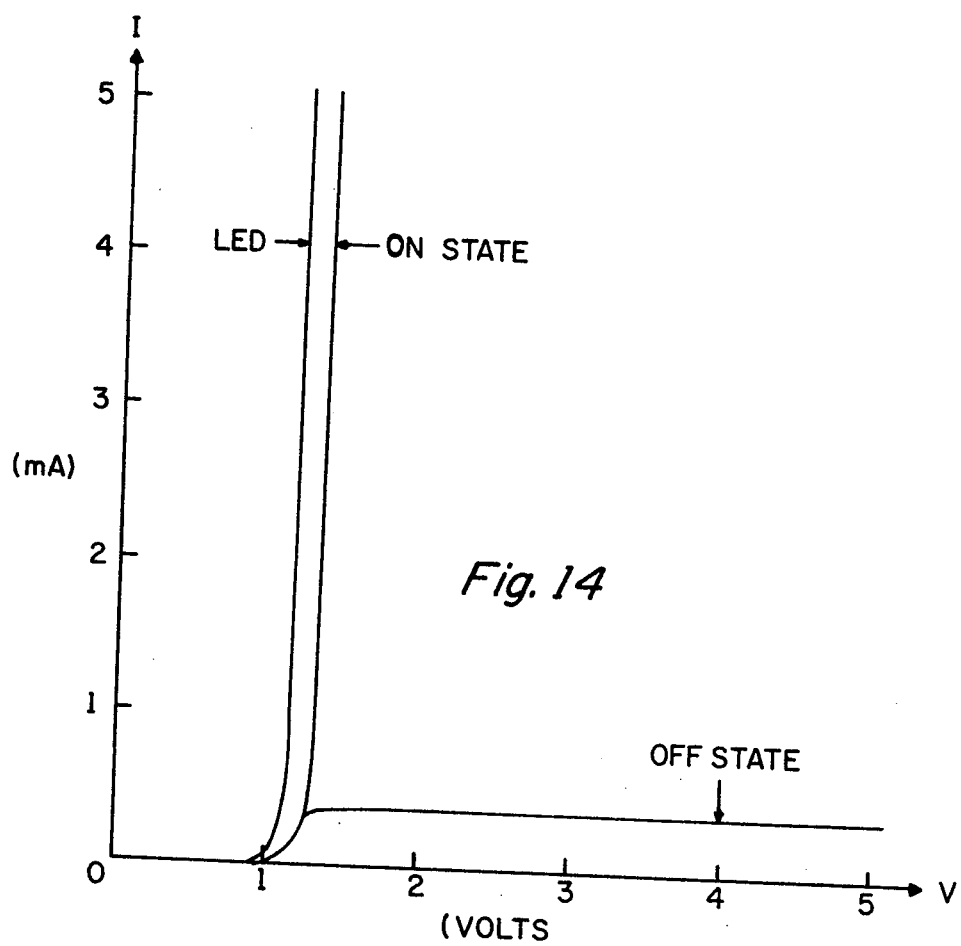

A preferred embodiment of the two-terminal optical sensor circuit is shown schematically in FIG. 11 and exhibits the V-I characteristic drawn in FIG. 14. This circuit does not have the pronounced negative resistance region in its on state characteristic that the simpler embodiments have. It can support a lower off state current; it has a faster transient response; and it has a greater reverse breakdown voltage. Using currently available compound it can be sealed to withstand 500 V, and to switch as much as 1.0 A.

A prototype of this circuit having an off state current of 0.25 MA, a turn-on time of 1.8 μsec, and a turn-off time of 30 μsec has been implemented.

Briefly, this circuit operates as follows. The LED, $D_1$, is always forward biased at a voltage greater than the emitter-base voltage of Q2. This voltage difference generates a current through R1 which passes through Q2 and is amplified by Q3. Thus, when Q1 is blocked an "off" state current, $$I_{\text{-off}} = (h_{FEQ3} + 1)\frac{V_{D1} - V_{EBQ2}}{R_1},$$

is generated. When Q1 is optically coupled to D1 the amplifier in this circuit, Q3, quickly saturates due to the positive feedback formed around it by D1 and Q1. By connecting the emitter of Q1 to the emitter of Q2, rather than the base of Q3, the voltage across Q1 is kept nearly constant and less time is required to charge the collector-emitter capacitance of Q1.

Figure 12:
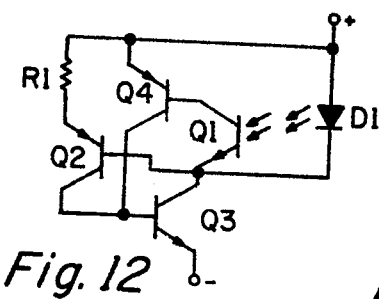

A variation of this circuit is shown in FIG. 12 where an additional transistor Q4 is added to the amplifier. This circuit is more sensitive and can support a lower off state current but the response time also increases. A prototype of this circuit displayed an "off" current of 0.09 MA, a $t_{on}$ of 15 μsec, and a $t_{off}$ of 110 μsec.

Figure 13:
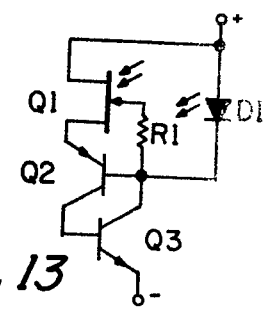

Another embodiment is shown in FIG. 13. This circuit would use a photo-FET as both the light sensing element and off state current generator. The sensitivity of Q1, a function of R1, would not vary with current and may make possible reduced off state currents.

References:
1. Adirovich et al, Soviet Physics—Doklady, Vol. 11, No. 5, pp. 419-21, November, 1966.
2. Adirovich et al, Soviet Physics—Doklady, Vol. 14, No. 6, pp. 538-41, December, 1969.
3. Adirovich et al, Soviet Physics—Doklady, Vol, 14, No. 6, pp. 550-52, December, 1969.
4. Adirovich et al, Soviet Physics—Doklady, Vol. 14, No. 6, pp. 578-80, December, 1969.

I claim:

1. A two-terminal optical sensor comprising an electroluminescent component optically coupled with a light sensing component, a resistance means, and means for electrically biasing said electroluminescent component, said light sensing component and said resistance means in parallel relationship, said electroluminescent component having amplifier means electrically coupled in series therewith, driven by the output from said light sensing component.

2. An optical sensor as in claim 1 further including means for amplifying the output of said light sensing component.

3. An optical sensor as in claim 2 wherein said means for amplifying the output of said light sensor includes a transistor coupled in emitter-collector series relationship between said biasing means and said means for amplifying the output of said electroluminescent component.

4. A sensor as in claim 1 wherein said electroluminescent component is a light-emitting diode.

5. A sensor as in claim 1 wherein said optical coupling includes an air gap, whereby an opague object may enter and cause decoupling.

6. A sensor as in claim 1 wherein said amplifying means is a transistor having its collector and emitter coupled in series with said electroluminescent component, and its base connected to receive said output.

7. A sensor as in claim 1 wherein said sensing component is a phototransistor connected to drive an amplifier in series with said electroluminescent component.

8. A sensor as in claim 1 wherein said amplifying means consists of more than one transistor connected so as to provide a constant voltage across said sensing component.

9. A sensor as in claim 8 further including a resistor in parallel with said sensing component as a means of independently biasing said electroluminescent component.

10. A sensor as in claim 1 wherein the electroluminescent and light-sensing components are mounted to permit optical coupling by reflection of the light through an indirect path.

* * * * *